United States Patent
Onishi

(10) Patent No.: US 7,495,262 B2
(45) Date of Patent: Feb. 24, 2009

(54) COMPOUND SEMICONDUCTOR, METHOD FOR PRODUCING THE SAME, SEMICONDUCTOR LIGHT-EMITTING DEVICE AND METHOD FOR FABRICATING THE SAME

(75) Inventor: Toshikazu Onishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 11/227,292

(22) Filed: Sep. 16, 2005

(65) Prior Publication Data

US 2006/0081872 A1    Apr. 20, 2006

Related U.S. Application Data

(62) Division of application No. 10/460,174, filed on Jun. 13, 2003, now Pat. No. 6,991,955.

(30) Foreign Application Priority Data

Jun. 13, 2002  (JP) ............................. 2002-172336

(51) Int. Cl.
*H01L 31/072* (2006.01)
(52) U.S. Cl. ..................... 257/94; 257/96; 257/102; 257/E33.209; 372/45.01; 372/46.01
(58) Field of Classification Search ............... 257/13, 257/14, 96, 102, 103, E33.024, E33.026, 257/E33.027, E33.029
See application file for complete search history.

(56) References Cited

U.S. PATENT DOCUMENTS

| | | | |
|---|---|---|---|
| 5,079,184 A | 1/1992 | Hatano et al. | |
| 5,381,756 A * | 1/1995 | Kondo et al. | 117/104 |
| 5,381,758 A | 1/1995 | Kondo et al. | |
| 5,621,748 A | 4/1997 | Kondo et al. | |
| 6,107,647 A * | 8/2000 | Matsumoto et al. | 257/94 |
| 6,440,764 B1 * | 8/2002 | Focht et al. | 438/22 |

FOREIGN PATENT DOCUMENTS

| | | |
|---|---|---|
| JP | 04-212488 | 8/1992 |
| JP | 06-013334 | 1/1994 |
| JP | 06-045708 | 2/1994 |
| JP | 06-077585 | 3/1994 |
| JP | 10-135567 | 5/1998 |

OTHER PUBLICATIONS

Japanese Office Action, with English Translation, issued in corresponding Japanese Patent Application No. JP 2002-172336, mailed on Jan. 15, 2008.

* cited by examiner

*Primary Examiner*—Ngan Ngo
*Assistant Examiner*—Benjamin Tzu-Hung Liu
(74) *Attorney, Agent, or Firm*—McDermott Will & Emery LLP

(57) ABSTRACT

An inventive method includes the steps of: growing a first p-type semiconductor layer of a compound semiconductor containing phosphorus on a substrate; and growing a second p-type semiconductor layer of a compound semiconductor containing arsenic on the first p-type semiconductor layer. While the first p-type semiconductor layer is grown, magnesium is added to the first semiconductor layer. While the second p-type semiconductor layer is grown, a p-type impurity other than magnesium is added to the second semiconductor layer.

6 Claims, 5 Drawing Sheets

COMPOUND SEMICONDUCTOR, METHOD FOR PRODUCING THE SAME, SEMICONDUCTOR LIGHT-EMITTING DEVICE AND METHOD FOR FABRICATING THE SAME

RELATED APPLICATION

This application is a divisional of application Ser. No. 10/460,174 filed Jun. 13, 2003 now U.S. Pat. No. 6,991,955.

BACKGROUND OF THE INVENTION

The present invention relates to compound semiconductors constituted by using AlGaInP-based semiconductor materials and AlGaAs-based semiconductor materials, methods for producing the compounds, semiconductor light-emitting devices and method for fabricating the devices.

Digital versatile disk (DVD) apparatus can record information at extremely high density, and thus has sprung into wide use in the fields of personal computers and audiovisual systems. In particular, writable or rewritable DVD apparatus is expected to become further widespread as, for example, a large-capacity external memory (e.g., a so-called DVD-R or DVD-RAM) or a next-generation audiovisual recorder (e.g., a DVD recorder) replacing a videotape recorder. To fulfill this expectation, improvement in write speed is a significant task.

In such a writable or rewritable DVD apparatus, a semiconductor laser which emits red light with a wavelength of about 650 nm is used as a pickup light source for reading out or writing data. Thus, the semiconductor laser needs to have its output power enhanced in order to increase the write speed of the DVD apparatus. More specifically, the semiconductor laser is required to operate with a high output power exceeding 100 mW.

Hereinafter, a semiconductor laser emitting red light will be described as a known example with reference to the drawings.

FIG. 4 shows a cross-sectional structure of a semiconductor laser according to the known example. As shown in FIG. 4, an n-type cladding layer 102 of AlGaInP; an active layer 103 having a quantum well structure in which AlGaInP layers and GaInP layers are alternately stacked; a first p-type cladding layer 104 of AlGaInP; and an etching stopper layer 105 of GaInP are stacked in this order over a substrate 101 of n-type GaAs. A ridged second p-type cladding layer 106 of AlGaInP is formed on the etching stopper layer 105, and a first contact layer 107 of p-type GaInP is formed thereon. A current blocking layer 108 of AlInP is formed so as to surround the second p-type cladding layer 106 on the etching stopper layer 105 and the first contact layer 107. A second contact layer 109 of p-type GaAs is formed on the first contact layer 107 and the current blocking layer 108.

In this case, each of the semiconductor layers over the substrate 101 is formed through crystal growth using a MOCVD or MBE process.

An n-side electrode 110 and a p-side electrode 111 are formed on a surface of the substrate 101 opposite to the n-type cladding layer 102 and on the second contact layer 109, respectively.

However, the known semiconductor laser has an energy band structure in which the bandgap (band offset) to the conduction band between the active layer 103 and the first p-type cladding layer 104 is small. Therefore, if the semiconductor laser produces a high output power at high temperature, electrons injected into the active layer 103 are flown into the first p-type cladding layer 104, i.e., so-called electron overflow occurs, so that components of the injected electrons which do not attribute to the emission increase. As a result, it is difficult for the laser to operate with a high output power.

To suppress such electron overflow in the active layer 103, it is effective to dope the first p-type cladding layer 104 with a p-type impurity at a high concentration so as to increase a barrier against electrons.

However, since zinc (Zn), which is usually used as a p-type impurity, has a large diffusion coefficient in an AlGaInP-based semiconductor material, Zn unwantedly diffuses from the first p-type cladding layer 104 into the quantum well in the active layer 103 during the crystal growth or heat treatment in the process for fabricating the semiconductor laser. Accordingly, if the first p-type cladding layer 104 is doped with a p-type impurity at a high concentration, Zn diffused into the quantum well in the active layer 103 brings about a nonradiative recombination center, thereby reducing the luminous efficiency. The diffusion of Zn also causes the crystallinity in the quantum well to deteriorate, thus arising a problem that the reliability of the semiconductor laser decreases.

To solve these problems, the present inventor used magnesium (Mg) having a small diffusion coefficient as a p-type impurity and set the Mg concentrations at about $1 \times 10^{18}$ cm$^{-3}$ in the first p-type cladding layer 104, etching stopper layer 105, second p-type cladding layer 106 and first contact layer 107 and at about $3 \times 10^{18}$ cm$^{-3}$ in the second contact layer 109, respectively, in the known semiconductor laser shown in FIG. 4.

However, if Mg is used as a p-type impurity in the known semiconductor laser, there arises another problem that the operating voltage increases so that operation with a high output power is inhibited by heat generated in an element.

The present inventor conducted various studies to find a cause of such a problem. As a result, from the fact that the impurity concentration decreases remarkably in part of the second contact layer 109 near the interface between the second contact layer 109 and the first contact layer 107 because of a phenomenon called doping delay, the present inventor found that no doping delay occurs in a compound semiconductor containing phosphorus as a Group V element, whereas doping delay occurs in a compound semiconductor containing arsenic as a Group V element.

Hereinafter, doping characteristics of Mg in the respective semiconductor layers of the known semiconductor laser will be described with reference to the drawing.

FIG. 5 shows a concentration profile of magnesium in the known semiconductor laser measured with secondary ion mass spectrometry (SIMS). In FIG. 5, the ordinate represents impurity concentration (Mg concentration), while the abscissa represents the depth from the top of the second contact layer 109 to the bottom of the n-type cladding layer 102. At the top of the graph, reference numerals denoting the respective semiconductor layers are attached, corresponding to the depth represented by the abscissa.

As shown in FIG. 5, the Mg concentration in the first p-type cladding layer 104, etching stopper layer 105, second p-type cladding layer 106 and first contact layer 107, each of which is made of AlGaInP or GaInP, is about $1 \times 10^{18}$ cm$^{-3}$ as set above. The diffusion of Mg toward the active layer 103 does not reach the quantum well and is suppressed such that the diffusion stops in a waveguiding layer on the upper side of the quantum well.

However, though the second contact layer 109 of GaAs is doped with Mg such that the Mg concentration is about $3 \times 10^{18}$ cm$^{-3}$, the Mg concentration is reduced to about $1 \times 10^{17}$ cm$^{-3}$ in a part of the second contact layer 109 at a distance of about 0.1 µm from the interface between the second contact layer 109 and the first contact layer 107.

This is considered to be due to a phenomenon that Mg does not enter the second contact layer 109 during the crystal growth of the layer 109 even if the given amount of Mg is supplied in an initial stage of the crystal growth. Such a phenomenon that a dopant does not enter a semiconductor layer during the crystal growth thereof is called doping delay, which is known as a phenomenon peculiar to magnesium (Mg) among the p-type impurities.

It is still unclear why the doping delay as described above occurs. However, as shown in FIG. 5, through the first p-type cladding layer 104, etching stopper layer 105, second p-type cladding layer 106 and first contact layer 107, each of which contains phosphorus (P) as a Group V element, have mutually different compositions of Group III elements, almost every part of the semiconductor layers in the depth direction is doped with the impurity at a substantially uniform concentration, whereas doping delay occurs only in the second contact layer 109 containing arsenic (As) as a Group V element. From this fact, it can be said that no doping delay occurs in a compound semiconductor containing P as a Group V element, while doping delay occurs in a compound semiconductor containing As as a Group V element.

Such a difference in doping characteristic is considered to be due to the fact that the adsorption activity of Mg to the crystal growth surface is greater in the case where the Group V element of a Group III-V compound semiconductor is P than in the case where the Group V element is As, when an MOCVD or MBE process is used.

In this way, the present inventor has clarified the following phenomenon. That is to say, if Mg is used as a p-type impurity in the known semiconductor laser, doping delay occurs in an AlGaAs-based semiconductor, so that the impurity concentration is insufficient in part of the second contact layer 109 near the interface between the second contact layer 109 and the first contact layer 107, and the resistance increases. Accordingly, the operating voltage and the series resistance increase, so that operation with a high output power is inhibited by heat generated in an element.

As described above, in a case where Zn is used as a p-type impurity, if the concentration of Zn is high, Zn diffuses into the active layer 103, so that it is difficult to suppress the electron overflow in order to increase the output power.

SUMMARY OF THE INVENTION

It is therefore an object of the present invention to dope a semiconductor layer of AlGaInP and a semiconductor layer of AlGaAs with p-type impurities at desired concentrations so as to enable a semiconductor light-emitting device utilizing the AlGaAs semiconductor layer and the AlGaInP semiconductor layer to operate with a high output power.

In order to achieve this object, according to the present invention, the AlGaInP semiconductor layer is doped with Mg and the AlGaAs semiconductor layer is doped with a p-type impurity other than Mg, based on the finding of the present inventor that no doping delay occurs in a compound semiconductor containing phosphorus as a Group V element and doping delay occurs in a compound semiconductor containing arsenic as a Group V element.

Specifically, an inventive method for producing a compound semiconductor includes the steps of a) growing a first semiconductor layer of a compound semiconductor containing phosphorus on a substrate, while adding magnesium to the first semiconductor layer; and b) growing a second semiconductor layer of a compound semiconductor containing arsenic on the first semiconductor layer, wherein in the step b), a p-type impurity other than magnesium is added to the second semiconductor layer.

With the inventive method for producing a compound semiconductor, it is possible to produce a compound semiconductor in which the p-type impurity in the first semiconductor layer is prevented from diffusing to the substrate and decrease in the impurity concentration due to doping delay does not occur in the second semiconductor layer. Accordingly, if the first semiconductor layer is used as a p-type cladding layer and the second semiconductor layer is used as a contact layer in a semiconductor light-emitting device, electron overflow is suppressed by adding the impurity to the p-type cladding layer at a high concentration, and in addition, the resistance is reduced by uniformly adding the impurity to the contact layer. As a result, the semiconductor light-emitting device can operate with a high output power and high reliability.

In the inventive method for producing a compound semiconductor, in the step b), the p-type impurity is preferably added over substantially the entire period from when formation of the second semiconductor layer begins to when the formation ends.

In the inventive method for producing a compound semiconductor, in the step b), the second semiconductor layer is preferably grown with magnesium further added to the second semiconductor layer. Then, even if the impurity concentration decreases by doping delay of magnesium in the second semiconductor layer, the addition of the p-type impurity other than magnesium secures a desired impurity concentration.

In the inventive method for producing a compound semiconductor, in the step b), the p-type impurity is preferably added only for a predetermined period from when formation of the second semiconductor layer begins.

In the inventive method for producing a compound semiconductor, the p-type impurity is preferably an element selected from the group consisting of zinc, beryllium and carbon.

In this case, the p-type impurity is preferably carbon.

An inventive compound semiconductor includes: a first semiconductor layer formed on a substrate and made of a compound semiconductor which is doped with magnesium and contains phosphorus; and a second semiconductor layer formed on the first semiconductor layer and made of a compound semiconductor which is doped with a p-type impurity other than magnesium and contains arsenic.

In the inventive compound semiconductor, the p-type impurity in the first semiconductor layer is prevented from diffusing to the substrate, and decrease in the impurity concentration due to doping delay does not occur in the second semiconductor layer. Accordingly, if the first semiconductor layer is used as a p-type cladding layer and the second semiconductor layer is used as a contact layer in a semiconductor light-emitting device, electron overflow is suppressed by doping the p-type cladding layer with the impurity at a high concentration, and in addition, the resistance is reduced by uniformly doping the contact layer with the impurity. As a result, the semiconductor light-emitting device can operate with a high output power and high reliability.

In the inventive compound semiconductor, the p-type impurity is preferably substantially uniformly distributed in the second semiconductor layer in the direction of thickness.

In the inventive compound semiconductor, the second semiconductor layer is preferably further doped with magnesium.

In the inventive compound semiconductor, only a part of the second semiconductor layer at the interface between the second semiconductor layer and the first semiconductor layer is preferably doped with the p-type impurity.

In the inventive compound semiconductor, the p-type impurity is preferably an element selected from the group consisting of zinc, beryllium and carbon.

In this case, the p-type impurity is preferably carbon.

An inventive method for fabricating a semiconductor light-emitting device includes the steps of: a) forming an n-type cladding layer and an active layer in this order over a substrate; b) growing a first semiconductor layer of a compound semiconductor containing phosphorus on the active layer, while adding magnesium to the first semiconductor layer; and c) growing a second semiconductor layer of a compound semiconductor containing arsenic on the first semiconductor layer, wherein in the step c), a p-type impurity other than magnesium is added to the second semiconductor layer.

With the inventive method for fabricating a semiconductor light-emitting device, the impurity in the first semiconductor layer is prevented from diffusing to the active layer and decrease in the impurity concentration due to doping delay does not occur in the second semiconductor layer. Accordingly, electron overflow is suppressed by adding the impurity to the first semiconductor layer at a high concentration, and in addition, the second semiconductor layer is used as a contact layer with the resistance reduced. As a result, the semiconductor light-emitting device can operate with a high output power and high performance.

In the inventive method for fabricating a semiconductor light-emitting device, in the step c), the p-type impurity is preferably added over substantially the entire period from when formation of the second semiconductor layer begins to when the formation ends.

In the inventive method for fabricating a semiconductor light-emitting device, in the step c), the second semiconductor layer is preferably grown with magnesium further added to the second semiconductor layer.

In the inventive method for fabricating a semiconductor light-emitting device, in the step c), the p-type impurity is preferably added only for a predetermined period from when formation of the second semiconductor layer begins.

In the inventive method for fabricating a semiconductor light-emitting device, the p-type impurity is preferably an element selected from the group consisting of zinc, beryllium and carbon.

In this case, the p-type impurity is preferably carbon.

In the inventive method for fabricating a semiconductor light-emitting device, in the step b), magnesium is preferably added at a concentration of $5 \times 10^{17}$ cm$^{-3}$ or more. Then, electron overflow in the active layer is suppressed as intended.

An inventive semiconductor light-emitting device includes: an n-type cladding layer formed on a substrate; an active layer formed on the n-type cladding layer; a first semiconductor layer formed on the active layer and made of a compound semiconductor which is doped with magnesium and contains phosphorus; and a second semiconductor layer formed on the first semiconductor layer and made of a compound semiconductor which is doped with a p-type impurity other than magnesium and contains arsenic.

In the inventive semiconductor light-emitting device, the p-type impurity in the first semiconductor layer is prevented from diffusing to the active layer and decrease in the impurity concentration due to doping delay does not occur in the second semiconductor layer. Accordingly, electron overflow in the active layer is suppressed by using the first semiconductor layer as a p-type cladding layer which is doped with the impurity at a high concentration as well as the second semiconductor layer is used as a contact layer with the resistance reduced. As a result, the semiconductor light-emitting device can operate with a high output power.

In the inventive semiconductor light-emitting device, the p-type impurity is preferably substantially uniformly distributed in the second semiconductor layer in the direction of thickness.

In the inventive semiconductor light-emitting device, the second semiconductor layer is preferably further doped with magnesium.

In the inventive semiconductor light-emitting device, only a part of the second semiconductor layer at the interface between the second semiconductor layer and the first semiconductor layer is preferably doped with the p-type impurity.

In the inventive semiconductor light-emitting device, the p-type impurity is preferably an element selected from the group consisting of zinc, beryllium and carbon.

In this case, the p-type impurity is preferably carbon.

In the inventive semiconductor light-emitting device, the first semiconductor layer is preferably doped with magnesium at a concentration of $5 \times 10^{17}$ cm$^{-3}$ or more.

DESCRIPTION OF THE PREFERRED EMBODIMENTS

Figure 1:
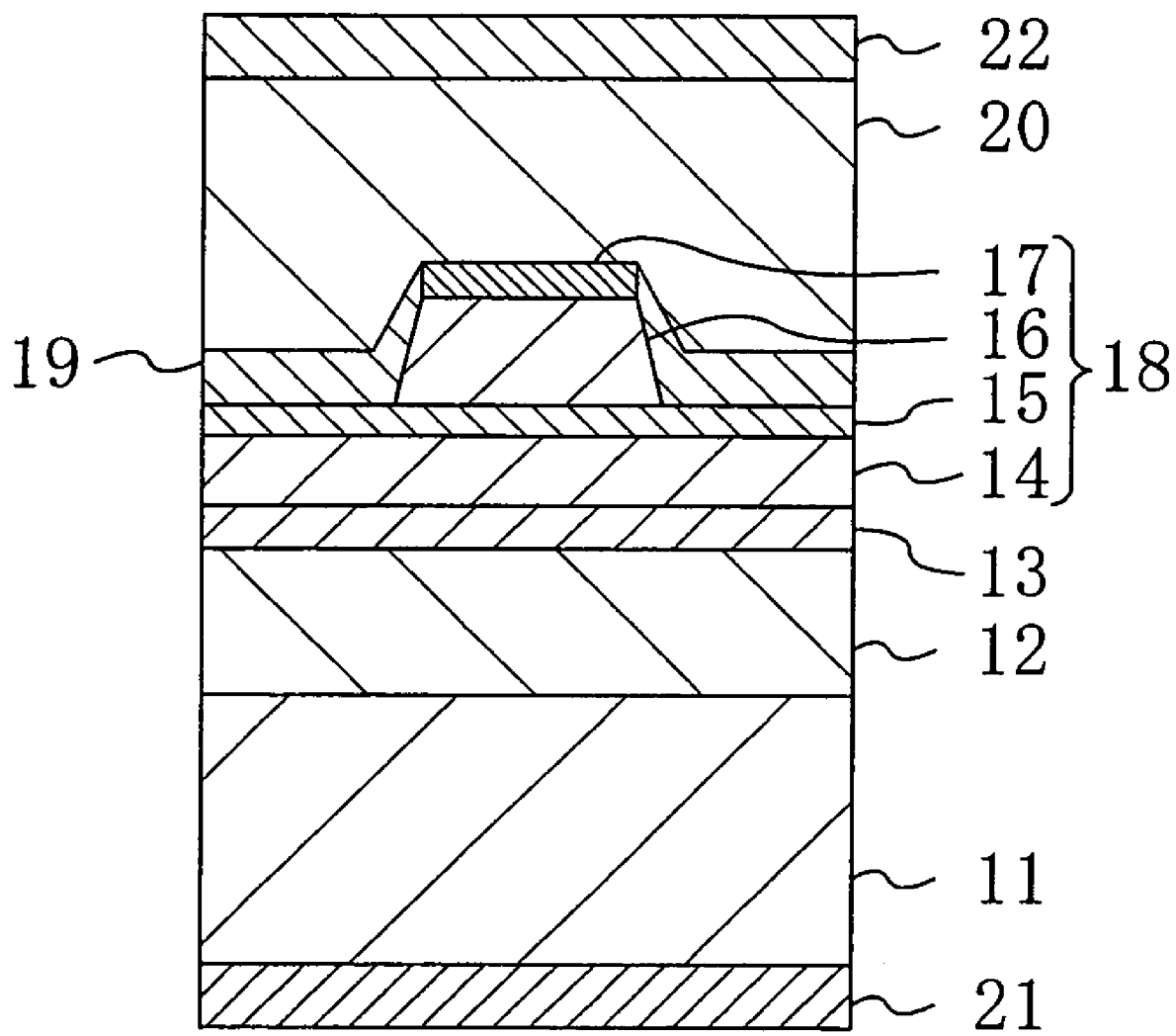
FIG. 1 shows a cross-sectional structure of a semiconductor light-emitting device according to an embodiment of the present invention.

An embodiment of the present invention will be described with reference to the drawing. AlGaInP is herein referred to as a compound containing at least one of aluminum (Al), gallium (Ga) and indium (In) as a Group III element, containing phosphorus (P) as a Group V element and expressed by the chemical formula $Al_xGa_yIn_{1-x-y}P$ (where $0 \leq x \leq 1$, $0 \leq y \leq 1$ and $0 \leq x+y \leq 1$). AlGaAs is herein referred to as a compound containing at least one of Al and Ga as a Group III element, containing arsenic (As) as a Group V element and expressed by the chemical formula $Al_zGa_{1-z}As$ (where $0 \leq z \leq 1$).

FIG. 1 shows a cross-sectional structure of a semiconductor light-emitting device according to the present invention. As shown in FIG. 1, an n-type cladding layer 12 of n-type $Al_{0.35}Ga_{0.15}In_{0.5}P$ having a thickness of about 2 μm; an active layer 13 as a stack of a plurality of semiconductor layers of AlGaInP; a first p-type cladding layer 14 of p-type $Al_{0.35}Ga_{0.15}In_{0.5}P$ having a thickness of about 0.2 μm; and an etching stopper layer 15 of p-type $Ga_{0.5}In_{0.5}P$ having a thickness of about 10 nm are stacked in this order over a substrate 11 of n-type GaAs. On the etching stopper layer 15, a second p-type cladding layer 16 of p-type $Al_{0.35}Ga_{0.15}In_{0.5}P$ having a thickness of about 1 μm and a first contact layer 17 of p-type $Ga_{0.5}In_{0.5}P$ having a thickness of about 50 nm are formed in a ridge shape extending in the direction of a resonant cavity.

The first p-type cladding layer 14, the etching stopper layer 15, the second p-type cladding layer 16 and the first contact layer 17 are herein referred to as a p-type AlGaInP layer 18.

A current blocking layer 19 of n-type $Al_{0.5}In_{0.5}P$ having a thickness of about 0.3 μm is formed so as to surround the second p-type cladding layer 16 and the first contact layer 17 on the etching stopper layer 15 except for the top of the first contact layer 17, thereby having a striped opening on the top of the first contact layer 17. A second contact layer 20 of p-type GaAs having a thickness of about 3 μm is formed on the first contact layer 17 and the current blocking layer 19.

An n-side electrode 21 made of an alloy of, for example, Au, Ge and Ni is formed on a surface of the substrate 11 opposite to the n-type cladding layer 12 to make an ohmic contact with the substrate 11. A p-side electrode 22 made of an alloy of, for example, Cr, Pt and Au is formed on the second contact layer 20 to make an ohmic contact with the second contact layer 20.

Although not shown, the active layer 13 has a multi-quantum well structure made up of: a quantum well configured by alternately stacking well layers of $Ga_{0.5}In_{0.5}P$ each having a thickness of about 5 nm and barrier layers of $Al_{0.25}Ga_{0.25}In_{0.5}P$ each having a thickness of about 6 nm with two of the well layers located as the uppermost and lowermost layers; and waveguiding layers of $Al_{0.25}Ga_{0.25}In_{0.5}P$ sandwiching the quantum well therebetween and each having a thickness of about 20 nm. Each of the well layers has a bandgap corresponding to a wavelength of 650 nm.

With respect to the respective semiconductor layers, examples of specific thicknesses, compound compositions, dopants and the concentrations of the dopants are shown in Table 1.

TABLE 1

| Semiconductor layer | Thickness | Compound composition | doping condition dopant | Concentration (cm$^{-3}$) |
|---|---|---|---|---|
| Second contact layer | 3 μm | GaAs | Zn | $3 \times 10^{18}$ |
| Current blocking layer | 0.3 μm | $Al_{0.5}In_{0.5}P$ | Si | $1 \times 10^{18}$ |
| First contact layer | 50 nm | $Ga_{0.5}In_{0.5}P$ | Mg | $1 \times 10^{18}$ |
| Second p-type cladding layer | 1 μm | $Al_{0.35}Ga_{0.15}In_{0.5}P$ | Mg | $1 \times 10^{18}$ |
| Etching stopper layer | 10 nm | $Ga_{0.5}In_{0.5}P$ | Mg | $1 \times 10^{18}$ |
| First p-type cladding layer | 0.2 μm | $Al_{0.35}Ga_{0.15}In_{0.5}P$ | Mg | $1 \times 10^{18}$ |
| Active layer Quantum well | | | | |
| Well layers | 6 nm Each layer | $Ga_{0.5}In_{0.5}P$ | — | — |
| Barrier layers | 5 nm Each layer | $Al_{0.25}Ga_{0.25}In_{0.5}P$ | — | — |
| Waveguiding layer | 20 nm Each layer | $Al_{0.25}Ga_{0.25}In_{0.5}P$ | — | — |
| N-type cladding layer | 2 μm | $Al_{0.35}Ga_{0.15}In_{0.5}P$ | Si | $1 \times 10^{18}$ |
| N-type substrate | 100 μm | GaAs | Si | $1 \times 10^{18}$ |

As shown in Table 1, the substrate 11 and the n-type cladding layer 12 are doped with silicon (Si) as an n-type impurity. The p-type AlGaInP layer 18 (i.e., the first p-type cladding layer 14, the etching stopper layer 15, the second p-type cladding layer 16 and the first contact layer 17) is doped with Mg as a p-type impurity at a concentration of about $1 \times 10^{18}$ cm$^{-3}$. The second contact layer 20 of GaAs is doped with Zn as a p-type impurity at a concentration of about $3 \times 10^{18}$ cm$^{-3}$.

Hereinafter, the distribution of the p-type impurities in the semiconductor light-emitting device thus fabricated according to this embodiment will be described with reference to the drawing.

Figure 2:
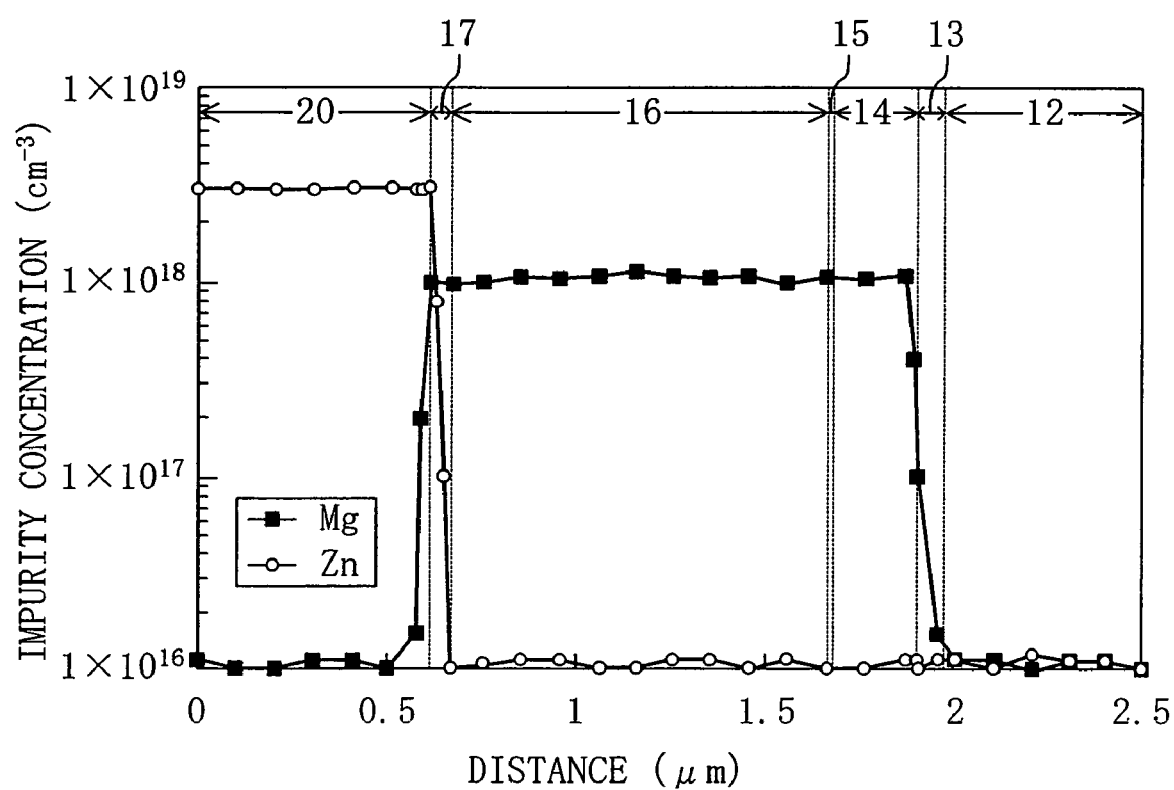
FIG. 2 shows concentration profiles of p-type impurities in the semiconductor light-emitting device of the embodiment.

FIG. 2 shows concentration profiles of the p-type impurities in the semiconductor light-emitting device of this embodiment measured with secondary ion mass spectrometry (SIMS). In FIG. 2, the ordinate represents concentrations of the p-type impurities (i.e., Mg and Zn), while the abscissa represents the depth from the top of the second contact layer 20 toward the substrate 11. At the top of the graph, reference numerals denoting the respective semiconductor layers are attached, corresponding to the depth represented by the abscissa.

As shown in FIG. 2, Mg as the p-type impurity is substantially uniformly distributed in almost every part of the first p-type cladding layer 14, etching stopper layer 15, second p-type cladding layer 16 and first contact layer 17 in the depth direction at a concentration of about $1 \times 10^{18}$ cm$^{-3}$. The p-type impurity Zn is substantially uniformly distributed in the second contact layer 20 at a concentration of about $3 \times 10^{18}$ cm$^{-3}$ in almost every part of the second contact layer 20 in the depth direction. The diffusion of Mg from the first p-type cladding layer 14 into the active layer 13 does not reach the quantum well and is suppressed such that the diffusion is stopped only in the waveguiding layer on the upper side of the quantum well.

Hereinafter, a method for fabricating a semiconductor device according to this embodiment will be described.

First, an n-type cladding layer 12, an active layer 13, a first p-type cladding layer 14, an etching stopper layer 15, a second p-type cladding layer 16 and a first contact layer 17 are grown in this order over a substrate 11 by a metal organic chemical vapor deposition (MOCVD) process or a molecular beam epitaxy (MBE) process. In this case, the n-type cladding layer 12 is grown, being doped with Si. The first p-type cladding layer 14, the etching stopper layer 15, the second p-type cladding layer 16 and the first contact layer 17 are grown, being doped with Mg.

Next, a silicon oxide film is deposited by, for example, a CVD process over the first contact layer 17, and then patterned into a striped shape using a photolithographic process and an etching process. Thereafter, the first contact layer 17 and the second p-type cladding layer 16 are selectively etched in this order using the patterned silicon oxide film as a mask, thereby forming the second p-type cladding layer 16 and the first contact layer 17 into a ridge shape.

Then, after a current blocking layer 19 has been formed by a MOCVD or MBE process, the silicon oxide film is subject to a lift-off process so that part of the current blocking layer 19 located on the top of the first contact layer 17 is removed, thereby forming a striped opening in the current blocking layer 19. Subsequently, a second contact layer 20 is grown on the first contact layer 17 and the current blocking layer 19 by a MOCVD or MBE process, being doped with Zn.

Thereafter, n- and p-side electrodes 21 and 22 are formed on a surface of the substrate 11 opposite to the n-type cladding layer 12 and on the second contact layer 20, respectively, by an electron beam evaporation process, for example. In this way, a semiconductor light-emitting device of this embodiment is fabricated.

In this embodiment, based on the finding of the present inventor that no doping delay occurs in a compound semiconductor containing phosphorus (P) as a Group V element and doping delay occurs in a compound semiconductor containing arsenic (As) as a Group V element, the p-type AlGaInP layer 18, i.e., the first p-type cladding layer 14, the etching stopper layer 15, the second p-type cladding layer 16 and the first contact layer 17, is doped with Mg, while the second contact layer 20 is doped with Zn, in the process steps for forming the respective semiconductor layers with the MOCVD or MBE process.

In this manner, diffusion of the p-type impurity is suppressed in the p-type AlGaInP layer 18 and no doping delay occurs in the second contact layer 20. Therefore, the respective semiconductor layers are doped with the p-type impurities at desired concentrations.

In the semiconductor light-emitting device of this embodiment, when a voltage is applied between the n- and p-side electrodes 21 and 22 and current is flown from the p-side electrode 22, the current is narrowed by the current blocking layer 19 and reaches the active layer 13, so that the device emits laser light with a wavelength of 650 nm corresponding to the bandgap of the well layers.

In this embodiment, Mg is used as a dopant for the p-type AlGaInP layer 18. Therefore, even if the concentration of the p-type impurity is set at as high as about $1 \times 10^{18}$ cm$^{-3}$, it is possible to suppress the diffusion of the p-type impurity from the first p-type cladding layer 14 into the active layer 13. Accordingly, it is possible to suppress the electron overflow from the active layer 13 into the first p-type cladding layer 14 without deteriorating the performance of the semiconductor light-emitting device, and thus the output power of the semiconductor light-emitting device can be enhanced.

Figure 4:
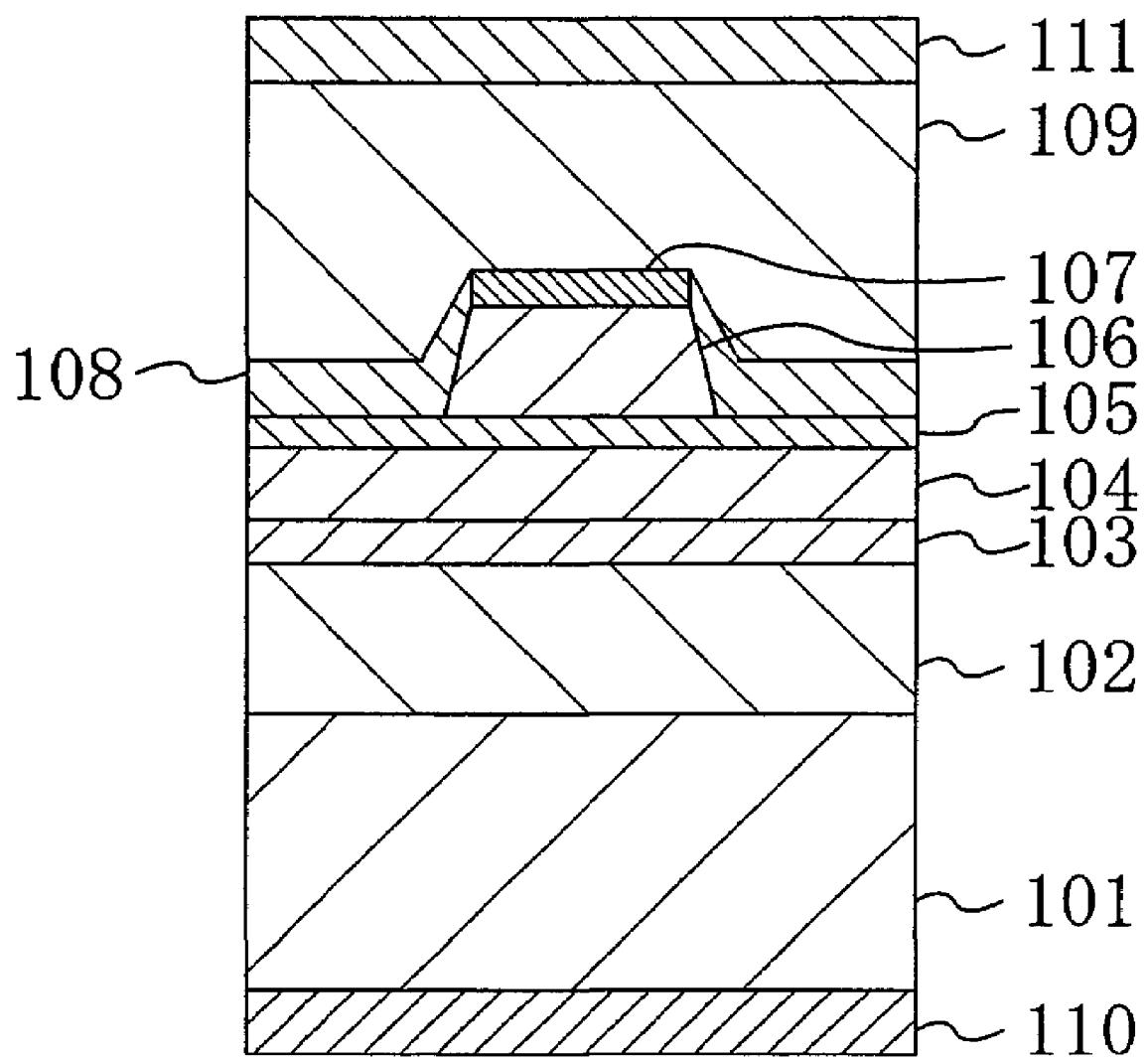
FIG. 4 shows a cross-sectional structure of a known semiconductor laser.
Figure 5:
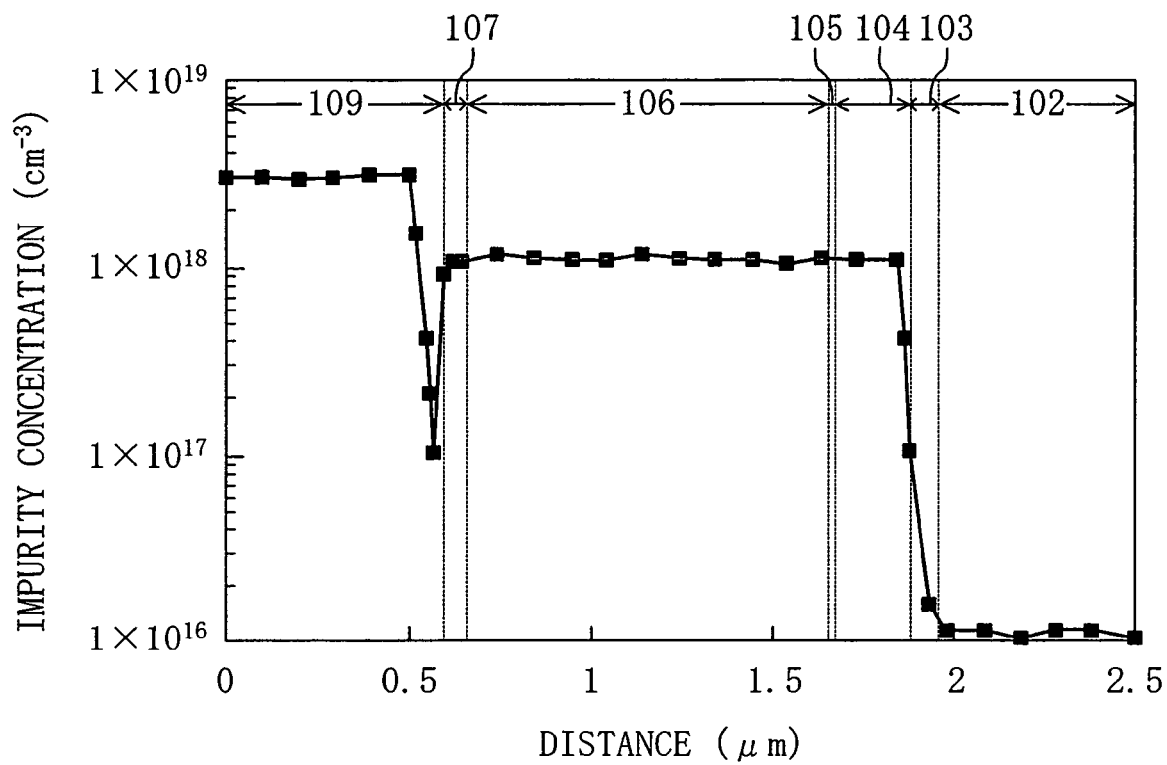
FIG. 5 shows a concentration profile of a p-type impurity in the known semiconductor laser.

In addition, since Zn is used as a dopant for the second contact layer 20 of GaAs, doping can be preformed uniformly at a high concentration. Thus, the series resistance of the semiconductor light-emitting device does not increase. In this case, since the second contact layer 20 is sufficiently apart from the active layer 13, Zn does not diffuse into the active layer 13. Accordingly, as compared to the case where Mg is used as a p-type dopant in the known semiconductor laser shown in FIG. 4, the resistance of the second contact layer is reduced and the operation voltage is thus reduced, resulting in enabling the device to operate with a high output power.

Specifically, in the semiconductor light-emitting device of this embodiment, the output power is not saturated at an ambient temperature of about 70° C., so that the device can operate with an output power as high as 120 mW.

MODIFIED EXAMPLE

Hereinafter, a modified example of the semiconductor light-emitting device according to the embodiment of the present invention will be described with reference to the drawing.

The semiconductor light-emitting device of this modified example has the same structure as that of the semiconductor light-emitting device shown in FIG. 1 and Table 1 except for the dopant composition in the second contact layer 20. Each component also shown in FIG. 1 is identified by the same reference numeral, and the description and the drawing of the device of the modified example are herein omitted.

The semiconductor light-emitting device of the modified example is different from the device of the embodiment in that the second contact layer 20 is doped with Mg as well as Zn, as a p-type impurity.

Hereinafter, distributions of the impurities in the semiconductor light-emitting device of the modified example will be described with reference to the drawing.

Figure 3:
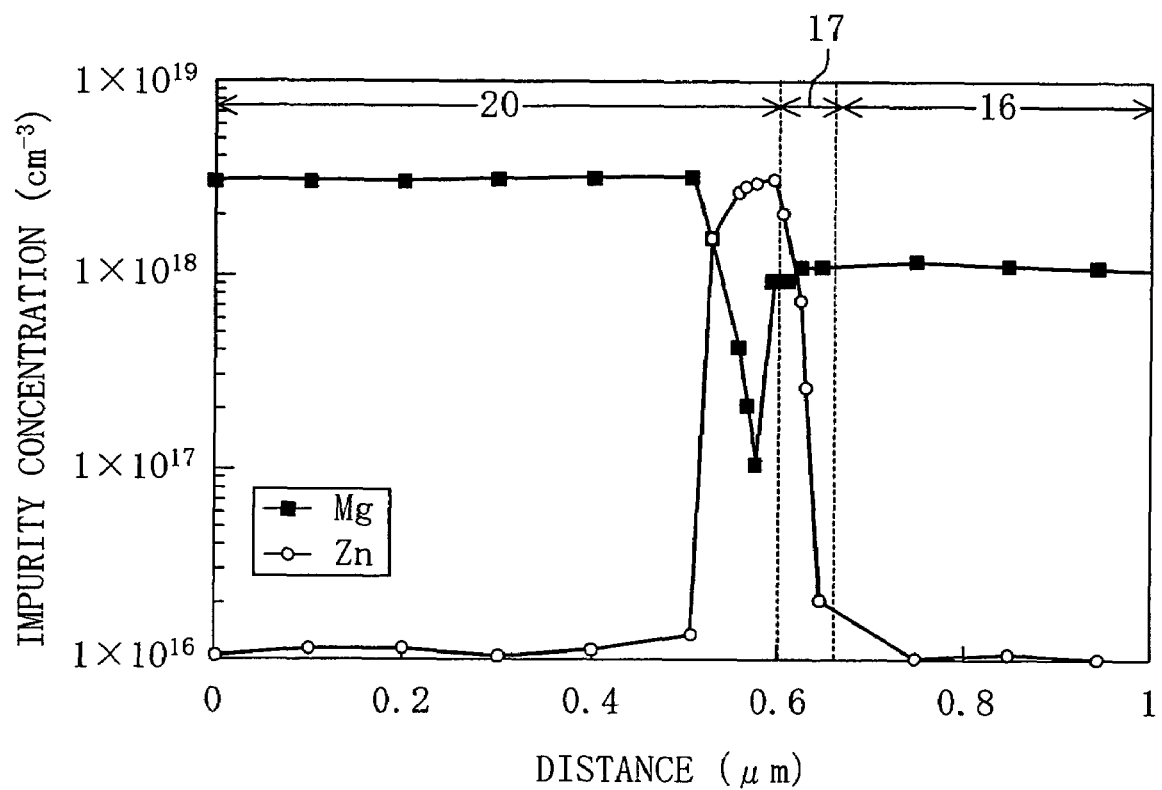
FIG. 3 shows concentration profiles of p-type impurities in a semiconductor light-emitting device according to a modified example of the embodiment.

FIG. 3 shows concentration profiles of p-type impurities in the semiconductor light-emitting device of the modified example measured with SIMS. In FIG. 3, the ordinate represents concentrations of the p-type impurities (i.e., Mg and Zn), while the abscissa represents the depth from the top of the second contact layer 20 toward the substrate 11. At the top of the graph, reference numerals denoting the respective semiconductor layers are attached, corresponding to the depth represented by the abscissa.

As shown in FIG. 3, in the modified example, substantially every part of the second contact layer 20 in the depth direction is doped with Mg, and a part of the second contact layer 20 within a distance of about 0.1 μm from the interface between the second contact layer 20 and the first contact layer 17 is doped with Zn, in addition to Mg.

In this case, in the part of about 0.1 μm in thickness doped with Zn, the Mg concentration decreases remarkably because of the doping delay. Specifically, the doping with Zn in the part of the second contact layer 20 near the interface between the second contact layer 20 and the first contact layer 17 can compensate for the decrease in Mg concentration. As a result, the impurity is distributed at a concentration of about $3 \times 10^{18}$ cm$^{-3}$ in almost every part of the second contact layer 20 in the depth direction.

Hereinafter, a method for fabricating a semiconductor light-emitting device according to the modified example will be described.

The method for fabricating a semiconductor light-emitting device of the modified example is the same as the method of the embodiment, up to the process step for forming a striped opening in the current blocking layer 19. Thus, the description thereof is herein omitted.

As in the embodiment of the present invention, after a striped opening has been formed in the current blocking layer 19, a second contact layer 20 is grown to a thickness of about 0.1 μm on the first contact layer 17 and the current blocking layer 19, being doped with Mg and Zn. Subsequently, the second contact layer 20 is further grown to a thickness of about 3 μm in total, being doped with Mg.

The growth of the second contact layer 20 with the doping with Mg and Zn is performed until the thickness thereof comes to about 0.1 μm. However, this growth may be performed until the thickness comes to a value at which doping delay occurs in the doping with Mg. Specifically, the second contact layer 20 may be doped with Zn in addition to Mg for a period corresponding to the thickness at which doping delay occurs and which is measured by previously measuring the concentration profile of Mg with SIMS.

As described above, in the semiconductor light-emitting device of the modified example, the p-type AlGaInP layer 18, i.e., the first p-type cladding layer 14, the etching stopper layer 15, the second p-type cladding layer 16 and the first contact layer 17, is doped with Mg so that the diffusion of the p-type impurity into the active layer 13 is suppressed, and in addition, the electron overflow from the active layer 13 to the first p-type cladding layer 14 is suppressed. As a result, it is possible to enhance the output power of the semiconductor light-emitting device.

In addition, almost every part of the second contact layer 20 of AlGaAs in the depth direction is doped with Mg, so that doping delay occurs in part of the second contact layer 20 near the interface between the second contact layer 20 and the first contact layer 17. However, if Zn is used so as to compensate for the decrease in the Mg concentration caused by the doping delay, the impurity concentration as it was set is achieved. As a result, it is possible to reduce the resistance in the second contact layer 20, thus allowing the device to operate with a high output power.

Specifically, in the semiconductor light-emitting device of the modified example, the output power is not saturated at an ambient temperature of about 70° C., so that the device can operate with an output power as high as 120 mW.

In the semiconductor light-emitting devices of the embodiment and the modified example thereof, the p-type impurity used for the doping of the second contact layer 20 is not limited to Zn and may be another p-type impurity, e.g., beryllium (Be) or carbon, which causes no doping delay during the formation of the AlGaAs semiconductor layer. In particular, since carbon has a small diffusion coefficient, the use of carbon as the p-type impurity added to the second contact layer 20 suppresses the diffusion of the p-type impurity from the contact layer 20 into the other semiconductor layers.

In the semiconductor light-emitting devices of the embodiment and the modified example thereof, in order to establish a lattice match between the AlGaInP layer 18 and the GaAs substrate 11, the In content of the AlGaInP layer 18 is set at about 0.5. However, if the In content of the AlGaInP layer 18 is within the range from 0.45 to 0.55, both inclusive, the AlGaInP layer 18 is lattice-matched to the GaAs substrate 11.

In the semiconductor light-emitting devices of the embodiment and the modified example thereof, the substrate 11 is not necessarily made of n-type GaAs. Alternatively, a p-type substrate of p-type GaAs may be used, for example In the embodiment and the modified example thereof, AlInP is used for the current blocking layer 19 so that a real refractive index waveguide is configured. Alternatively, a complex refractive index waveguide may be configured by using GaAs for the current blocking layer 19.

In the embodiment and the modified example thereof, the waveguide structure is not limited to the ridge waveguide structure. Even if the embodiment or the modified example thereof is applied to other waveguide structures such as an inner stripe waveguide, the same advantages are obtained.

In the embodiment and the modified example thereof, the active layer 13 is not limited to the multi-quantum well structure. Alternatively, the active layer 13 may be an active layer having a single quantum well structure or a bulk active layer having a single structure, for example.

Each of the inventive semiconductor light-emitting devices of the embodiment and the modified example thereof as described above is characterized in that, in a compound semiconductor in which an AlGaAs semiconductor layer (the second contact layer 20 in the embodiment and the modified example thereof) is stacked on an AlGaInP semiconductor layer (the p-type AlGaInP layer 18 in the embodiment and the modified example thereof), the AlGaInP layer is doped with Mg, and the AlGaAs semiconductor layer is doped with Zn at least in an initial stage of the formation of the AlGaAs semiconductor layer. This is based on the finding of the present inventor that no doping occurs in a compound semiconductor containing phosphorus as a Group V element, while doping delay occurs in a compound semiconductor containing arsenic as a Group V element.

In this manner, even if the concentration of a p-type impurity for doping is high, it is possible to prevent the p-type impurity in the AlGaInP semiconductor layer from diffusing into another semiconductor layer closer to the semiconductor substrate, and it is also possible to prevent doping delay in the AlGaAs semiconductor layer. Accordingly, a compound semiconductor which is doped with the p-type impurity at a desired concentration is obtained. As a result, the resultant compound semiconductor is applicable, as a semiconductor which is uniformly doped with a p-type impurity at a high concentration, to a semiconductor light-emitting device such as a semiconductor laser or a light-emitting diode.

What is claimed is:

1. A semiconductor laser device, comprising:
   an n-type cladding layer formed on a substrate;
   an active layer formed on the n-type cladding layer;
   a first semiconductor layer formed on the active layer and made of a compound semiconductor which is doped with magnesium and contains phosphorus; and
   a second semiconductor layer formed on the first semiconductor layer and made of a compound semiconductor which is doped with a p-type impurity other than magnesium and contains arsenic,
   wherein the p-type impurity is carbon,
   the bandgap of the second semiconductor layer is smaller than the bandgap of the first semiconductor layer, and
   the second semiconductor layer is made of a direct gap semiconductor.

2. The semiconductor laser device of claim 1, wherein the p-type impurity is substantially uniformly distributed in the second semiconductor layer in the direction of thickness.

3. The semiconductor laser device of claim 1, wherein the second semiconductor layer is further doped with magnesium.

4. The semiconductor laser device of claim 3, wherein only a part of the second semiconductor layer at the interface between the second semiconductor layer and the first semiconductor layer is doped with the p-type impurity.

5. The semiconductor laser device of claim 1, wherein the first semiconductor layer is doped with magnesium at a concentration of $5 \times 10^{17}$ cm$^{-3}$ or more.

6. The semiconductor laser device of claim 1, wherein
   the first semiconductor layer is a cladding layer, and the second semiconductor layer is a contact layer.

* * * * *